US011727970B2

(12) United States Patent
Hong

(10) Patent No.: US 11,727,970 B2
(45) Date of Patent: *Aug. 15, 2023

(54) MEMORY DEVICE FOR GENERATING WORD LINE SIGNALS HAVING VARYING PULSE WIDTHS

(71) Applicant: Taiwan Semiconductor Manufacturing Company Limited, Hsinchu (TW)

(72) Inventor: Hyunsung Hong, Kanata (CA)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 124 days.

This patent is subject to a terminal disclaimer.

(21) Appl. No.: 17/246,814

(22) Filed: May 3, 2021

(65) Prior Publication Data

US 2021/0257013 A1 Aug. 19, 2021

Related U.S. Application Data

(63) Continuation of application No. 16/724,734, filed on Dec. 23, 2019, now Pat. No. 11,004,488, which is a continuation of application No. 16/397,547, filed on Apr. 29, 2019, now Pat. No. 10,515,677, which is a continuation of application No. 15/860,767, filed on Jan. 3, 2018, now Pat. No. 10,276,223.

(60) Provisional application No. 62/488,961, filed on Apr. 24, 2017.

(51) Int. Cl.
*G11C 8/08* (2006.01)
*G11C 8/10* (2006.01)
*G11C 8/18* (2006.01)
*G11C 7/06* (2006.01)
*G11C 7/22* (2006.01)
*H03K 5/133* (2014.01)
*G11C 7/08* (2006.01)
*G11C 7/18* (2006.01)

(52) U.S. Cl.
CPC ............ *G11C 8/08* (2013.01); *G11C 7/06* (2013.01); *G11C 7/222* (2013.01); *G11C 8/10* (2013.01); *G11C 8/18* (2013.01); *H03K 5/133* (2013.01); *G11C 7/08* (2013.01); *G11C 7/18* (2013.01)

(58) Field of Classification Search
CPC .................................. G11C 8/18; G11C 8/08
See application file for complete search history.

(56) References Cited

U.S. PATENT DOCUMENTS

| 5,418,480 A | 5/1995 | Hastie et al. |
| 7,412,477 B1 | 8/2008 | Jennings |
| 2003/0001650 A1 | 1/2003 | Cao et al. |
| 2005/0184776 A1 | 8/2005 | Pilo et al. |
| 2005/0237093 A1 | 10/2005 | Wilhite et al. |
| 2006/0033544 A1 | 2/2006 | Hui et al. |
| 2006/0274574 A1 | 12/2006 | Choi et al. |
| 2010/0054049 A1 | 3/2010 | Yamaoka et al. |
| 2011/0051502 A1 | 3/2011 | Rao et al. |

(Continued)

FOREIGN PATENT DOCUMENTS

KR 20110110432 10/2011

*Primary Examiner* — Douglas King
(74) *Attorney, Agent, or Firm* — Jones Day

(57) ABSTRACT

A memory device includes a plurality of memory cells, a plurality of word lines, and a word line driver. The word lines are respectively coupled to the memory cells. The word line driver is configured to respectively drive the word lines with word line signals that have varying pulse widths.

20 Claims, 14 Drawing Sheets

(56) References Cited

U.S. PATENT DOCUMENTS

| | | |
|---|---|---|
| 2011/0242912 A1 | 10/2011 | Kang et al. |
| 2013/0039137 A1 | 2/2013 | Yasuda |
| 2013/0214833 A1 | 8/2013 | Kim |
| 2013/0250690 A1 | 9/2013 | Lai et al. |

MEMORY DEVICE FOR GENERATING WORD LINE SIGNALS HAVING VARYING PULSE WIDTHS

CROSS-REFERENCE TO RELATED APPLICATION

This application is a continuation of U.S. patent application Ser. No. 16/724,734, filed on Dec. 23, 2019; which is a continuation of U.S. patent application Ser. No. 16/397,547, filed on Apr. 29, 2019, now U.S. Pat. No. 10,515,677; which is a continuation of U.S. patent application Ser. No. 15/860,767, filed on Jan. 3, 2018, now U.S. Pat. No. 10,276,223; which claims priority to U.S. Provisional Application No. 62/488,961, filed on Apr. 24, 2017; all of which are incorporated herein by reference in their entireties.

BACKGROUND

A typical read operation of a memory cell of a memory device includes connecting a data line pair to a local bit line pair connected to the memory cell. A word line connected to the memory cell is driven with a word line signal, thus transferring bits of data stored in the memory cell to the data lines through the local bit line, whereby the bits of data are read from the memory cell. The memory device may have memory cells connected to single bit lines or complementary bit lines depending on the application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
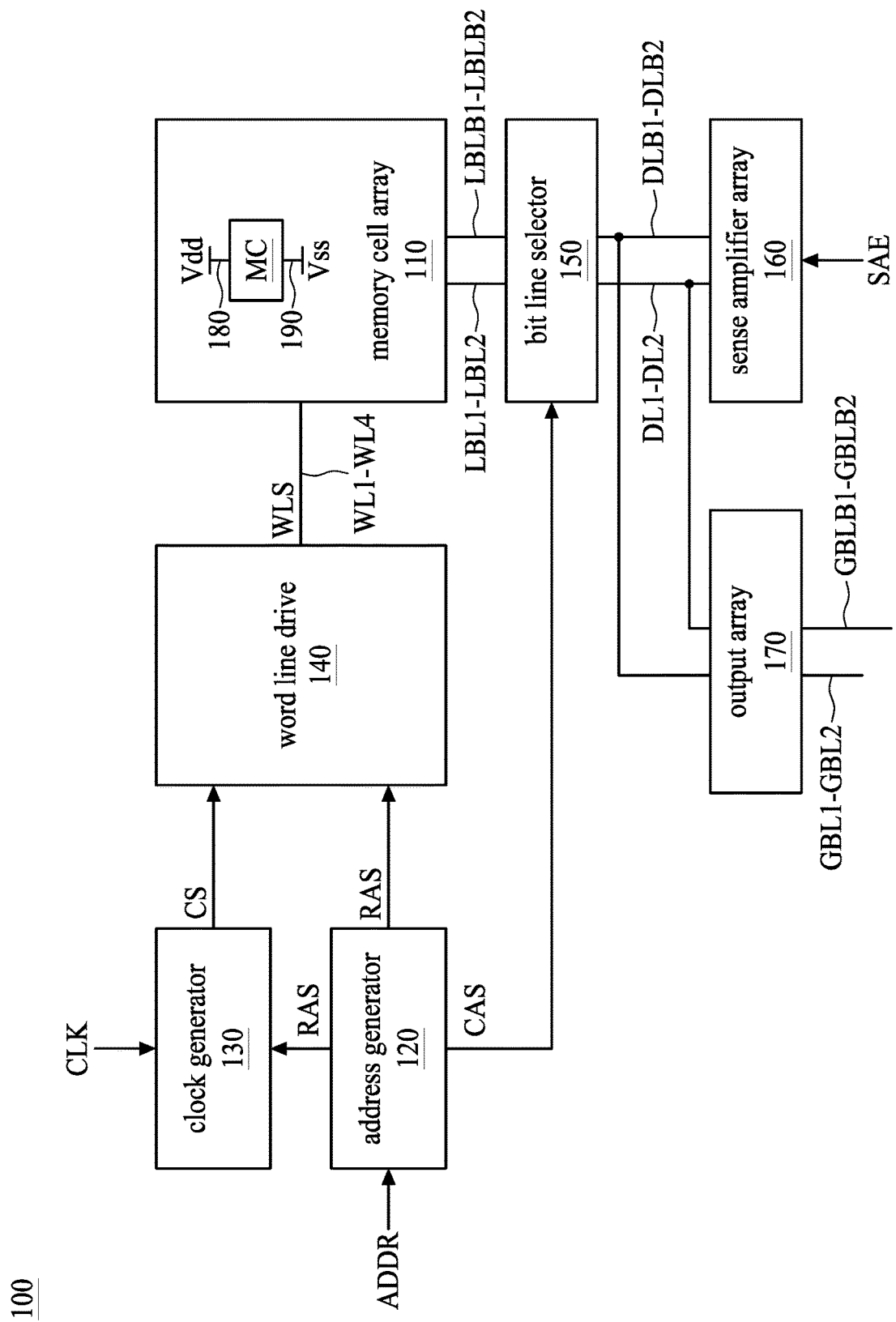
FIG. 1 is a schematic diagram illustrating an exemplary memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A conventional memory device includes a memory cell array and a word line driver. The word line driver is configured to drive a word line connected to a memory cell of the memory cell array with a word line signal during a read operation on the memory cell. In order to ensure proper read operations on memory cells of the memory cell array, pulse widths of word line signals generated by the word line driver are made uniformly, as will be explained below. This can result in an unnecessarily high power consumption by the conventional memory device. In general to ensure an accurate read from a memory cell array, the pulse width of the word line must be longer in duration than the rise time of a bit line, or the rise time of a pair complementary bit lines (e.g. BTL/BLB). This read margin, the voltage difference detected on the bit line(s), develops over a period of time proportional to the length of the line connecting the memory cell to the sense amplifier. This is because each bit line has its own resistance and capacitance (RC) characteristics, which differ based on the length of the line.

FIG. 1 is a schematic diagram illustrating an exemplary memory device 100 in accordance with some embodiments. Systems and methods as described herein include a memory device, e.g., memory device 100 in FIG. 1, configured to generate word line signals that have varying pulse widths. The memory device 100 of FIG. 1 includes a memory cell array 110, a word line driver 140, a bit line selector 150, an address generator 120, a clock generator 130, a sense amplifier array 160, and an output array 170. When it is desired to read a memory cell (MC) of the memory cell array 110, the bit line selector 150 connects a data line pair, e.g., data line pair (DL1, DLB1), to a local bit line pair, e.g., local bit line pair (LBL1, LBLB1), connected to the memory cell (MC). Then, the word line driver 140 drives a word line, e.g., word line (WL1), connected to the memory cell (MC) with a word line signal (WLS). The word line signal has a pulse width that varies with an address of the memory cell (MC), whereby the word line driver 140 generates word line signals that have varying pulse widths. As will be apparent below, such an implementation reduces a power consumption of the memory device 100, without causing improper read operations on memory cells of the memory device 100.

Address generator 120 determines which wordline drivers to activate based on an input signal ADDR. Clock generator 130 receives as input a clock signal (CLK), e.g. from computer processes outside the memory device 100 responsible for synchronizing the various components of a processing device that utilizes memory device 100. The address generator 120 output signal (RAS) is also provided to the clock generator 130, which generates an internal clock signal CS based on CLK and RAS signals as described further below. The sense amplifier array 160 includes an array of sense amplifiers, each connected to a corresponding bit line pair, and for amplifying the voltage difference sensed on the bit lines. This amplified sensed signal, representing the bits stored in each corresponding memory cell, is sent to the output array 170, which delivers the sensed contents of the memory cells to the external processing circuits. The example memory device 100 may be a random access memory (RAM) device, e.g., a static RAM (SRAM) or a dynamic RAM (DRAM), a read only memory (ROM) device, or other type of memory device.

Figure 2:
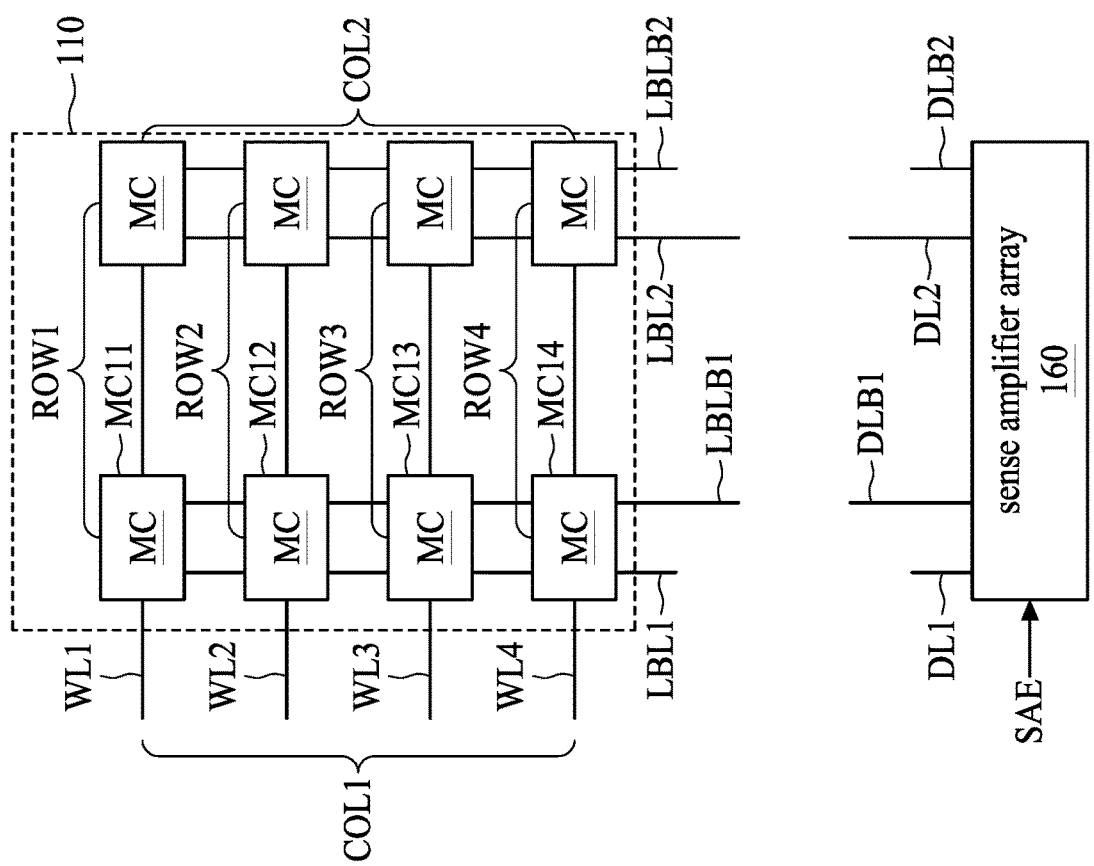
FIG. 2 is a schematic diagram illustrating an exemplary relative position between a memory cell array and a sense amplifier array in accordance with some embodiments.

The memory cell array 110 includes a plurality of memory cells, e.g., memory cells (MC) of FIG. 2, arranged in an array of columns and rows. As illustrated in FIG. 1, the memory cell (MC) is connected between first and second supply terminals 180, 190. The first supply terminal 180 is for receiving a first supply voltage (Vdd), e.g., 0.3V or 0.5V. It will be appreciated that the voltages identified are for exemplary purpose only, and that Vdd may be any suitable voltages for memory applications and remain within the scope of this disclosure. The second supply terminal 190 is for receiving a second supply voltage (Vss), e.g., 0V, −0.3V or −0.5V, that has a lower level than the first supply voltage (Vdd). The memory cell (MC) is configured to store complementary bits, '1' and '0', of data therein. It will be appreciated that the voltages identified are for exemplary purpose only, and that Vss may be any suitable voltages for memory applications and remain within the scope of this disclosure.

Each memory cell (MC) is assigned with a row address and a column address indicating position thereof in the array. The address generator 120 is configured to receive an input address signal (ADDR) to generate column and row addresses (CAS, RAS) of a memory cell (MC).

In embodiments, the clock generator 130 generates clock signals (e.g. CS) based on an external received clock signal (CLK) that is provided by the external processing device. The clock generator 130 is also connected to the address generator 120 and receives the address generator 120 RAS signal. The generated clock signal (CS) may have an amplitude that corresponds to, e.g., the same as, an amplitude of the input clock signal (CLK). And, as explained in detail below, the clock generator 130 is further configured to adjust a pulse width of the output clock signal (CS) based on the received row address (RAS). Thus, the output clock signal (CS) has pulse widths that vary with the row addresses (RAS) of the memory cells (MC).

Figure 2A:
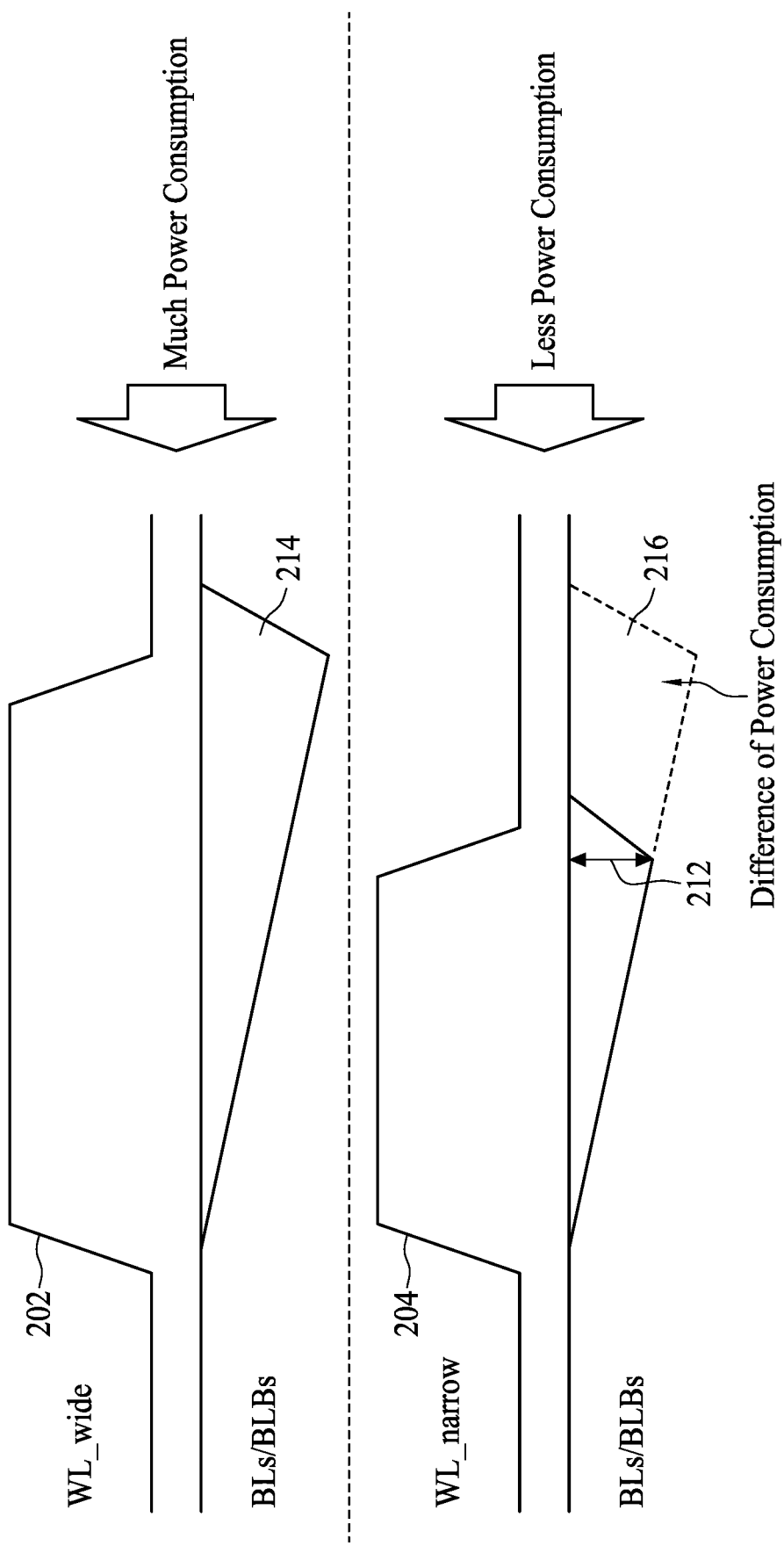
FIGS. 2a and 2b illustrate power consumption associated with asserting a word line and associated with the development of the bit line (BL) and bit line bar (BLB) voltages on a complementary bit line pair.
Figure 2B:
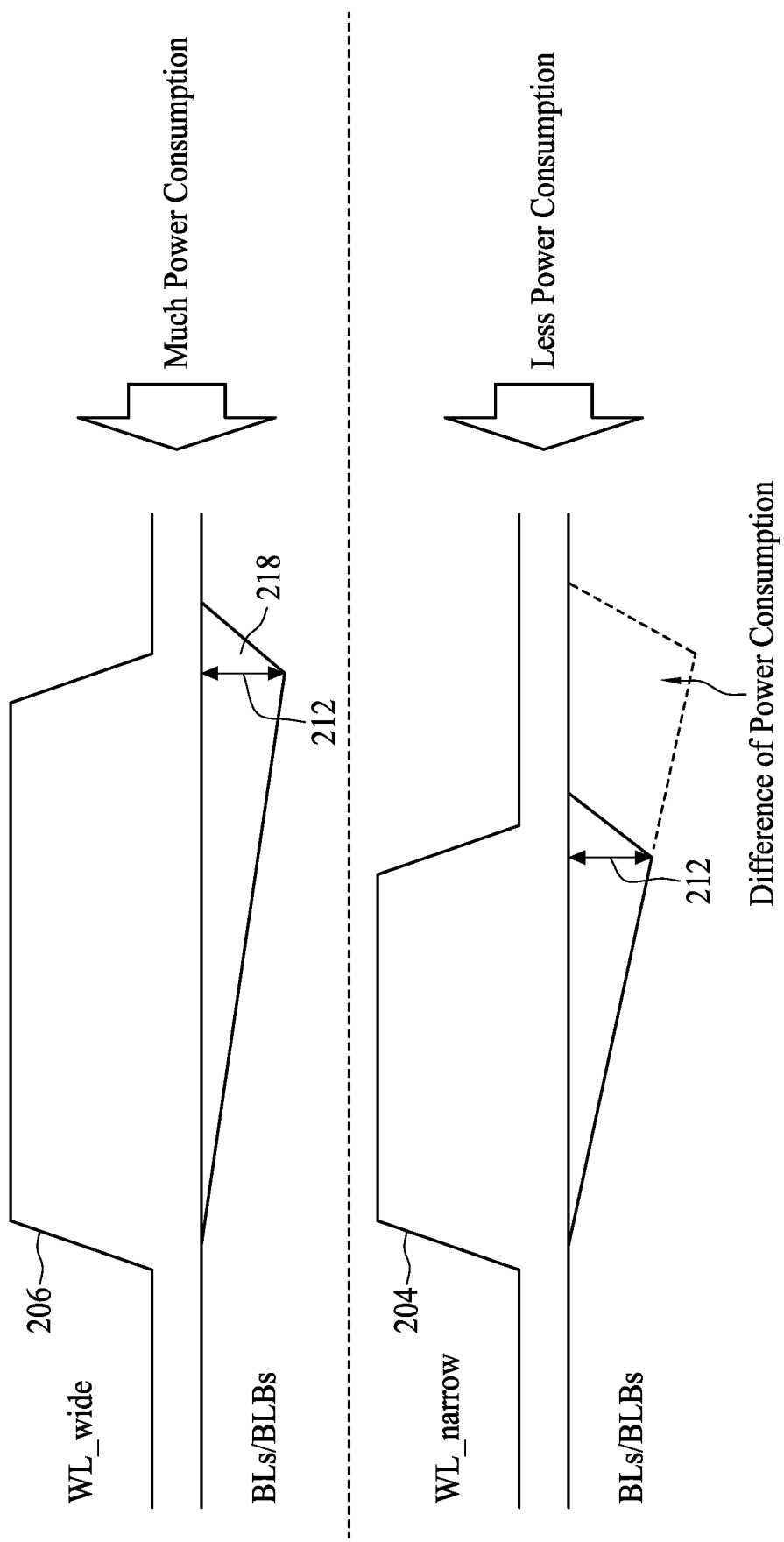

Generally, the line length of each line connecting each memory cell, e.g. MC within the memory cell array 110, to a corresponding sense amplifier in the sense amplifier array differs (e.g. it grows longer as the distance between a sense amplifier and a particular memory cell increases). As a line length increases, the RC characteristics of a line increase. Thus, the amount of time required for the bit line signal to develop on each bit line differs. Thus, systems that employ a single word line pulse width (e.g. one that is long enough to ensure a valid read margin for those memory cells furthest from their corresponding sense amplifiers) consume excessive power driving memory cells having short bit line lengths. By tailoring the length of the word line pulse width based on the length of the corresponding bit lines for a particular word line, the power consumed by the memory device 100 is reduced. This is illustrated in FIG. 2a. For example, in the array 110 as depicted in FIG. 2, the memory cells of ROW1 are further in distance from a corresponding sense amplifier in the sense amplifier array 160 than the MC14 in ROW4. Thus, if each word line pulse width is equal, e.g. equal to a pulse width 202 as shown in FIG. 2a, extra power is consumed driving the word line for MC14 having a RM 212. FIG. 2a illustrates driving MC14 using pulse 202, and a tailored pulse 204 that has a shorter period. Driving MC14 using pulse 202 develops voltage 214 over a greater period of time. But, because the read margin 212 does not require all of the voltage 214, excess power 216 is expended driving MC14 with a WL pulse having a length equal to pulse 202. Instead, by driving MC14 with pulse 204 having a narrow pulse width, excess power 216 is saved. Thus, by employing a narrower word line pulse, e.g. 204, for MC14, one that is long enough to ensure that the bit line voltages associated with MC14 can develop to their RM 212, an amount of power equal to the difference of power consumption 216 is conserved. As shown in FIG. 2b, each word line pulse width may correspond to the rise time necessary for each MC to achieve its RM 212. For example, MC11, in ROW1, may receive wide pulse 206, having a wider pulse width allowing the bitlines associated with MC1 to develop a voltage 218 over a longer period of time to achieve RM 212, while MC14 may receive narrow pulse 204 which is sufficient to allow the associated bitlines to develop to RM 212.

The memory device 100 further includes a plurality of word lines (e.g, WL1-WL4 are shown for illustrative purposes). Here four word lines (WL1-WL4) are shown for exemplary purposes, but it will be appreciated that other numbers are within the scope of this disclosure, e.g. 128, 256, 512, 1025 etc. Each word line (WL1-WL4) is connected to the memory cells (MC) in a respective row. The word line driver 140 is connected to the address generator 120, the clock generator 130, and the word lines (WL1-WL4). Word line driver 140 receives the RAS signal, which may identify the word line of the memory cells intended to be read, and word line driver 140 is configured to receive the clock signal (CS) from the clock generator 130 in order to generate a word line signal (WLS) on a particular word line. In embodiments, the word line signal (WLS) has a pulse width that corresponds to, e.g., is proportional to or the same as, a pulse width of the output clock signal (CS). Because clock generator 130 receives RAS from address generator 120, it is able to generate a clock pulse CS having a pulse width tailored to the intended word line (as described below). Thus, the word line signals (WLS) likewise have different pulse widths according pulse widths of the output clock signals (CS) associated with the word line addressed by the RAS signal.

In embodiments, the memory device 100 further includes a plurality of local bit line pairs, e.g., for illustrative purposes local bit line pair (LBL1, LBLB1) and local bit line pair (LBL2, LBLB2), and plurality of data line pairs, e.g., data line pair (DL1, DLB1) and data line pair (DL2, DLB2). While only two bit line pairs and two data line pairs are shown in this illustration, any number of bit line or data line pairs are within the scope of this disclosure. Here, also, two memory cells per word line are shown for exemplary purposes, but it will be appreciated that other numbers of memory cells per word line are within the scope of this disclosure, e.g. 2048, 4096, 8192 etc. Each local bit line pair (LBL1, LBLB1, LBL2, LBLB2) is connected to the memory cells (MC) in a respective column. The bit line selector 150 is connected to the address generator 120 and is further connected between the local bit line pairs (LBL1, LBLB1, LBL2, LBLB2) and the data line pairs (DL1, DLB1, DL2, DLB2). The bit line selector 150 is configured to receive the column address signal (CAS) to connect a data line pair to a local bit line pair, whereby in the example illustrated, complementary bits of data stored in a memory cell are transferred to the data line pair through the local bit line pair.

In embodiments, the sense amplifier array 160 includes an array of sense amplifiers, each sense amplifier of the array of sense amplifiers corresponding to a memory cell column and associated bit lines, is connected to the data line pairs (DL1, DLB1, DL2, DLB2). Here two sets of complementary bit lines are shown for exemplary purposes, but it will be appreciated that other numbers of sets of complementary bit lines are within the scope of this disclosure, e.g. 16, 32, 64, etc. The sense amplifier array 160 is configured to detect whether a read margin, i.e., the difference between voltage levels on a data line pair, decreases to a threshold level. The sense amplifier array 160 is further configured to receive a sense amplifier enable signal (SAE) when it is determined that the read margin decreases to less than the threshold level. The sense amplifier array 160 is further configured to connect a data line of a data line pair to the second supply terminal 190 in response to the sense amplifier enable signal (SAE) to pull the data line to a low voltage level, e.g., second supply voltage (Vss) level. Because the sense amplifier array 160 includes an array of sense amplifiers that are associated with bit-lines having different rise times, associated with each bit line's read margin, depending on which word line is addressed, it is also advantageous to time the SAE signal so that it is asserted after the corresponding bit line has had time to develop to achieve its read margin.

The memory device 100 further includes a plurality of global bit line pairs, e.g. for illustrative purpose, global bit line pair (GBL1, GBLB1) and global bit line pair (GBL2, GBLB2) are shown, but it will be appreciated that any number of global bit line pairs are within the scope of this disclosure. The output array 170 includes an array of outputs for transferring each data line pair (e.g. DL1, DLB1 or DL2, DLB2) to a corresponding global bit line pair, which may involve transferring data from one a first power domain to a second power domain. For illustrative purposes, the output array 170 is connected between the data line pairs (DL1, DLB1, DL2, DLB2) and the global bit line pairs (GBL1, GBLB1, GBL2, GBLB2). Here two sets of complementary global bit lines and data bit lines are shown for exemplary purposes, but it will be appreciated that other numbers of sets of complementary global bit lines and data bit lines are within the scope of this disclosure, e.g. 16, 32, 64, etc. The output array 170 is configured to connect a global bit line pair to a data line pair to transfer a low voltage level from a data line of the data line pair to a global bit line of a global bit line pair, whereby complementary bits of data is read from a memory cell.

As described above, the length of a signal line affects the RC characteristics of that line, and accordingly the rise times and fall times of voltages applied to those lines as signals differ. In an embodiment, the memory cell array 110 and the sense amplifier array 160 are positioned relative to each other such that time durations during which developing voltages rise and fall vary between word lines in the memory cell array 110. That is, memory cells within word lines that are closest to the sense amplifier array have the shortest rise and fall times, and thus the shortest time to achieve a desired read margin. Accordingly, memory cells within word lines that are farthest from the sense amplifier array have the longest rise and fall times, and thus take the longest amount of time to achieve a desired read margin. These differences in the voltage developing times to achieve read margin is determinable by the addresses of the memory cells (MC). As such, pulse widths of word lines signals can be made to vary according to those time durations to thereby reduce a power consumption of the memory device 100. For example, the sense amplifier array 160 may be positioned below the memory cell array 110, as illustrated in FIG. 2. In this way, the distance between sense amplifier in the sense amplifier array and a corresponding MC in a column of memory cells associated with that sense amplifier increases in a predictable and linear fashion from word line to word line. FIG. 2 is a schematic diagram illustrating an exemplary relative position between the memory cell array 110 and the sense amplifier array 160 in accordance with some embodiments.

The memory cell array 110 is provided with eight memory cells (MC) arranged in an array of columns (COL1, COL2) and rows (ROW1-ROW4). Each local bit line pair (LBL1, LBLB1, LBL2, LBLB2) is connected to the memory cells (MC) in a respective column (COL1, COL2). Here eight MCs arranged along two sets of complementary bit lines are shown for exemplary purposes, but it will be appreciated that other numbers of MCs and complementary bit lines and data bit lines are within the scope of this disclosure. Each word line (WL1-WL4) is connected to the memory cells (MC) in a respective row (ROW1-ROW4). It is understood that the memory cell array 110 may include any number of columns/rows in certain embodiments. In some embodiments, the memory cell (MC) is a six-transistor (6T) memory cell, i.e., includes six transistors, e.g., FET or other type of transistors. In other embodiments, the memory cell (MC) includes any number of transistors or may be other type of memory cell. It will be appreciated that the particular components of a memory cell will vary from technology to technology and application to application.

In the example of FIG. 2, the memory cells (MC) in the second row (ROW2), e.g., memory cell (MC12), are closer to the sense amplifier array 160 than the memory cells (MC) in the first row (ROW1), e.g., memory cell (MC11). Further, the memory cells (MC) in the third row (ROW3), e.g., memory cell (MC13), are closer to the sense amplifier array 160 than the memory cell (MC12), but farther from the sense amplifier array 160 than the memory cells (MC) in the fourth row (ROW4), e.g., memory cell (MC14). As such, the rise time of MC11 is greater than the rise time of MC12 which is greater than MC13 and which is greater than the rise time of MC14. Thus, the pulse width of the word line applied to MC14 need not be as long as the pulse width of the word line applied to MC11 in order to achieve the same read margin. In this way, the power consumed by reading MC14 is reduced over a device that applies a uniform pulse width to each word line. Similarly, the amount of time to required to perform a read of MC14 (and MC13, MC12) can be shortened relative to MC11, thereby achieving faster average Tcd performance overall, Tcd being the latency timing from the rising edge of a clock triggering a read operation to the time that valid data is available on the output.

Figure 3:
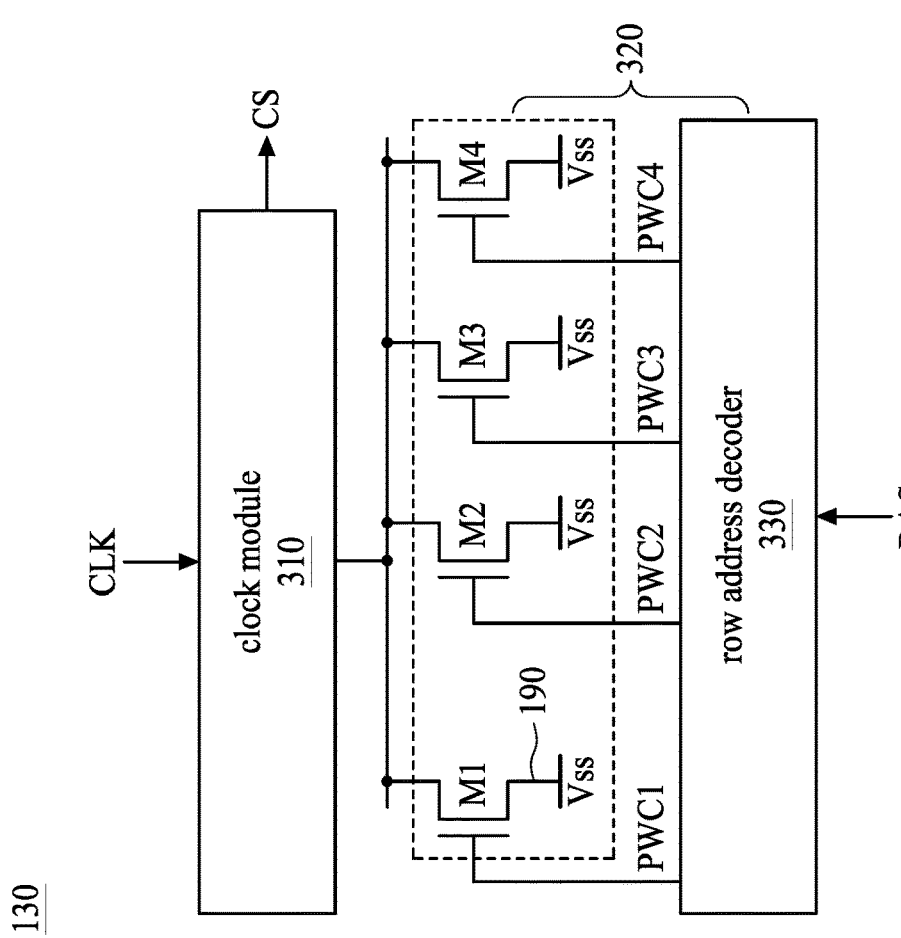
FIG. 3 is a schematic diagram illustrating an exemplary clock generator in accordance with some embodiments.

FIG. 3 is a schematic diagram illustrating an exemplary clock generator 130 in accordance with some embodiments. The example of FIG. 3 includes a clock module 310 and a pulse width controller 320. In some embodiments, the clock module 310 is configured to receive an input clock signal (CLK) to generate an output clock signal (CS) in a manner that is synchronized to an external circuit. The output clock signal (CS) may have an amplitude that corresponds to, e.g., the same as, an amplitude of the input clock signal (CLK). It will be appreciated, as above, that the number of components is for illustrative purposes only, various embodiments are within the scope of this disclosure.

The pulse width controller 320 is configured to receive the row address (RAS) to adjust a pulse width of the output clock signal (CS). In the example of FIG. 3, the pulse width controller 320 includes a row address decoder 330 and a plurality of transistors (M1-M4). The row address decoder 330 is configured to receive the row address (RAS) to generate a plurality of pulse width control signals (PWC1-PWC4). The transistors (M1-M4), e.g., field effect transistors (FET) or other type of transistors, have different sizes, e.g., width-to-length (W/L) ratios. These different W/L create different channel resistance and gate capacitances for each transistor. In embodiments each transistor is associated with a word line. Each transistor (M1-M4) is connected between the clock module 310 and the second supply terminal 190 (or the first supply terminal 180 in an alternative embodiment of the clock generator 130). Each transistor (M1-M4) is configured to receive a respective pulse width control signal (PWC1-PWC4) to selectively connect/disconnect the clock module 310 to/from the second supply terminal 190. Because the W/L ratios of each transistor M1-M4 differ by design, depending on which transistor is turned on responsive to a respective row address decoder signal 330 (PWC1, PWC2, PWC3, PWC4), the discharge time of the clock signal pulse as it is pulled down to Vss differs. In this way the pulse width controller 320 adjusts a pulse width of the output clock signal (CS). In the depicted embodiment, clock signal CS is delivered to a word line driver. The word line driver may trigger the generation of a word line signal based on the rising edge of the CS signal, and the end of a word line pulse may be dictated on the falling edge of the clock signal CS. In this way, by altering the discharge time of the clock signal, the length of the word line pulse generated by a word line driver can be modulated based on the row address. It is understood that such a clock generator 130 circuit is provided by way of example, not by limitation, and other suitable clock generator 130 circuits are within the scope of the present disclosure.

Figure 4:
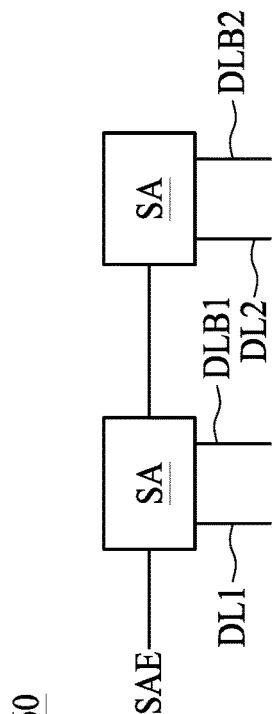
FIG. 4 is a schematic diagram illustrating an exemplary sense amplifier array in accordance with some embodiments.

The sense amplifier array 160 includes a plurality of sense amplifiers (SA), as illustrated in FIG. 4. FIG. 4 is a schematic diagram illustrating an exemplary sense amplifier array 160 in accordance with some embodiments. Here two sense amplifiers are shown corresponding to the two memory cell columns illustrated in the examples above, but it will be appreciated that other numbers of sense amplifiers are within the scope of this disclosure. For example, in embodiments there will be a separate sense amplifier within a sense amplifier array for each bit line, or complementary bit line pair, between a column of memory cells and the sense amplifier array. Each data line pair (DL1, DLB1, DL2, DLB2) is connected to a respective sense amplifier (SA) in the sense amplifier array. Each sense amplifier (SA) is configured to amplify the voltage differential on a bit line pair in order to ensure that the voltage differential is at a recognizable logic level in order to detect whether a read margin, i.e., the difference between voltage levels on a respective data line pair (DL1, DLB1, DL2, DLB2), decreases to less than a threshold value. Each sense amplifier (SA) is further configured to receive a sense amplifier enable signal (SAE) that is timed to enable amplification while the word line is asserted causing a bit line voltage to develop. In embodiments, the sense amplify enable signal is triggered by the falling edge of the word line pulse associated with a particular read operation. In this way, each sense amplifier is enabled at the appropriate time for the word line being sensed by the sense amplifiers (i.e. the word line being read during a particular read operation). The sense amplifier enables an accurate read of the memory cell contents, by amplifying the voltage difference sensed on the bitlines, allowing for accurate data to be available on the data lines at the output array for providing the stored bits to the global bit lines in response to a read request received from an external circuit. Depending on whether the bit lines are single bitlines or complementary bitlines, in some embodiments, the sense amplifier (SA) is a differential sense amplifier. In other embodiments, the sense amplifier (SA) is a single-ended sense amplifier or other type of sense amplifier.

Figure 5:
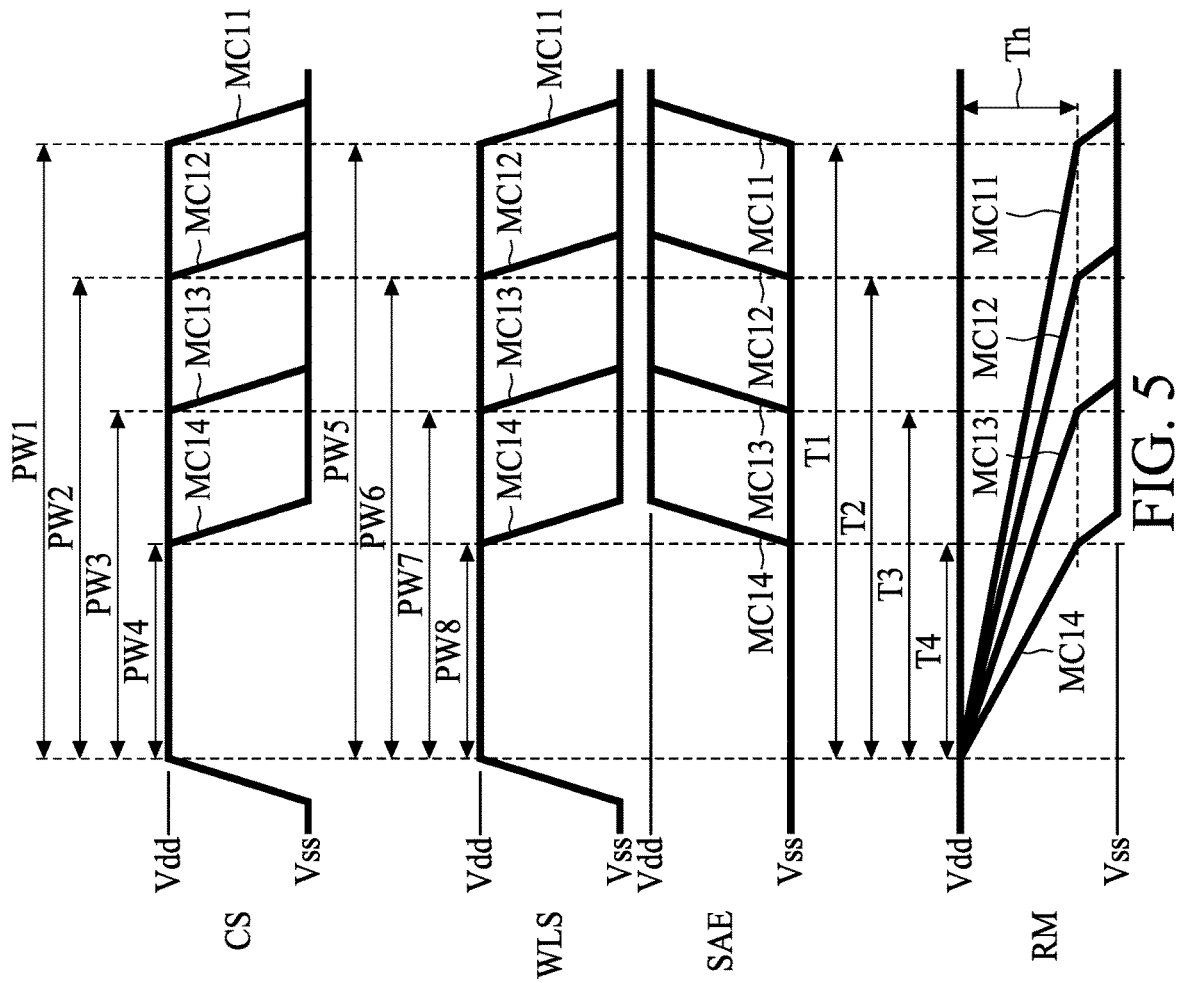
FIG. 5 is a timing diagram illustrating exemplary signals associated with read operations on memory cells in accordance with some embodiments.

FIG. 5 is a timing diagram illustrating exemplary signals (CS, WLS, SAE, RM) associated with read operations on the memory cells (MC11-MC14) in accordance with some embodiments. As can be seen from FIG. 5, a read margin (RM) associated with the memory cell (MC11) decreases from a high voltage level, e.g., first supply voltage (Vdd) level, to less than a threshold level (Th) within a time duration (T1). In addition, the output clock signal (CS) associated with the memory cell (MC11) has a pulse width (PW1), a duration of which is the same as the time duration (T1). Further, the word line signal (WLS) associated with the memory cell (MC11) has a pulse width (PW5) the same as the pulse width (PW1). Similarly, the SAE signal associated with MC11 is asserted on the falling edge PW5 of the WLS, ensuring that the read operation is amplified at the appropriate time by an associated sense amplifier in the sense amplifier array. As such, a proper read operation of the memory cell (MC11) is ensured. Similarly, SAE is asserted on the falling edge of each WLS, thus SAE is asserted at T4 for a WLS having PW4, which ensures the signal is amplified at the correct time corresponding to MC14 achieving threshold voltage (RM), and so on for SAE asserted in associating with a read on MC13 and MC12.

As noted above, the memory cells (MC12) is closer to the sense amplifier array 160 than the memory cell (MC11), thus it has different RC characteristics giving rise to a shorter fall time necessary for MC12 to achieve an appropriate RM (Th) on the associated bit lines than is required for MC11. The memory cell (MC13) is closer to the sense amplifier array 160 than the memory cells (MC12), but farther from the sense amplifier array 160 than the memory cells (MC14). Thus, as can be seen from FIG. 5, a read margin (RM) associated with the memory cell (MC12) decreases from the high voltage level (Vdd) to less than the threshold level (Th) within a time duration (T2) that is shorter than the time duration (T1). A read margin (RM) associated with the memory cell (MC13) decreases from the high voltage level (Vdd) to less than the threshold level (Th) within a time duration (T3) that is shorter than T1 and T2. The time duration (T3) is shorter than the time duration (T2), but is longer than a time duration (T4) within which a read margin (RM) associated with the memory cell (MC14) decreases from the high voltage level (Vdd) to less than the threshold level (Th).

In other approaches, pulse widths of word line signals are made the same as the widest pulse width of a word line signal, e.g., pulse width (PW5), to ensure proper read operations of memory cells of a memory device. This can result in an unnecessarily high power consumption by the memory device. In embodiments in accordance with this disclosure, pulse widths (PW6, PW7, PW8) of the word line signals (WLS), associated with the memory cells (MC12, MC13, MC14), have durations that are substantially the same, or only slightly longer, as the time durations (T2, T3, T4) for each MC to achieve threshold voltage. Thus, in embodiments, PW6-PW8 are narrower than the pulse width (PW5) and power consumption for the memory device 100 is thereby reduced, without causing improper read operations of the memory cells (MC) of the memory device 100.

Figure 6:
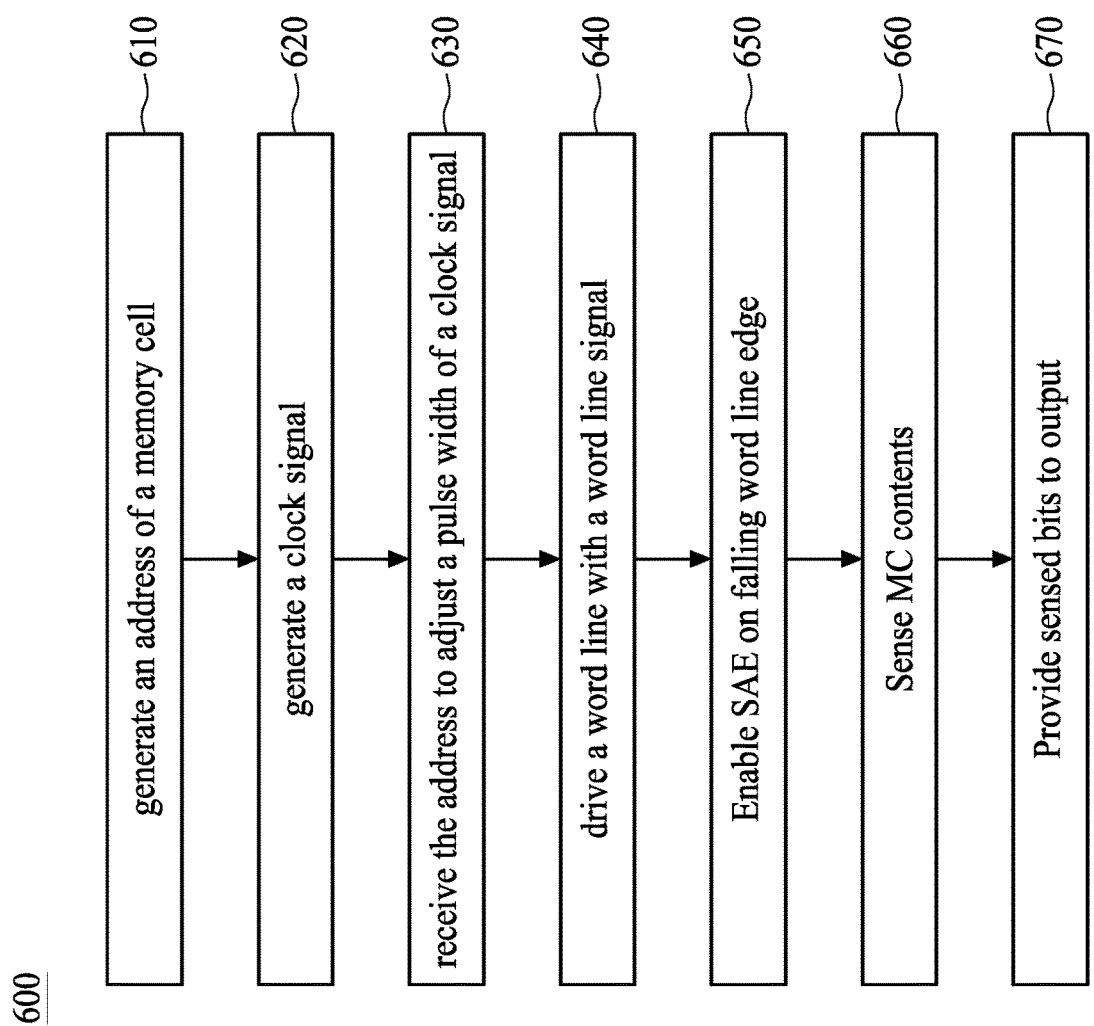
FIG. 6 is a flow chart illustrating an exemplary method of a read operation on a memory cell in accordance with some embodiments.

FIG. 6 is a flow chart illustrating an exemplary method 600 of read operations on a line of memory cells (e.g. MC11-MC14) in accordance with some embodiments. Method 600 will now be described with further reference to FIGS. 1-5 for ease of understanding. It is understood that method 600 is applicable to structures other than those of FIGS. 1-4. Further, it is understood that additional operations can be provided before, during, and after method 600, and some of the operations described below can be replaced or eliminated in an alternative embodiment of method 600.

When an external circuit requests a read operation, it may provide a read address corresponding to number of memory cells in a memory cell array. In exemplary operation 610, the address generator 120 receives an input address signal (ADDR) to generate the column and row addresses (CAS, RAS) of the memory cell (MC11) to be read. The bit line selector 150 receives the column address (CAS) to connect the data line pair (DL1, DLB1) to the local bit line pair (LBL1, LBLB1).

Next, in operation 620, the clock generator 130 receives an input clock signal (CLK) signaling time to generate an output clock signal (CS). CLK signal may be derived in an external circuit supplied by a first power supply domain, and CS is generated by clock generator 130 based on a power supply domain of the memory device 100. The output clock signal (CS) has an amplitude, e.g., first supply voltage (Vdd) level–second supply voltage (Vss) level.

In operation 630, the clock generator 130 receives the row address signal (RAS) based on which clock generator generates a CS having a pulse width (PW1) adjusted for the intended word line. The word line driver 140 receives the output clock signal (CS) having a tailored pulse width and generates a word line signal (WLS) having a pulse width based on the pulse width of the clock signal (CS). Thus, the word line signal (WLS) for the intended word line of memory cells has a pulse width (PW5) that corresponds to, e.g., the same as, the pulse width (PW1) of the output clock signal (CS). This PW5 is designed to allow for an appropriate amount of time for the read margin to develop on the associated bit lines.

In operation 640, the word line driver 140 receives the row address signal (RAS) to drive the word line (WL1) with the word line signal (WLS) having the pulse width adjusted based on the RAS as a result of the adjusted CS pulse width. Upon assertion of the WL1 signal, MC11 supplies its stored contents to the complementary data line pair LBL1, LBLB1, and the voltage differential between the complementary data lines develops towards a threshold voltage.

In operation 650, the sense amplify enable signal is asserted on the falling edge of the word line signal WL1, causing the sense amplifier (SA) to amplify the voltage difference allowing the contents of the memory cell to be sensed at operation 660 based on the voltage differential. For example, if a threshold voltage is exceeded, a bit value of 1 is sensed on the bitlines indicating a bit value of 1 is in the memory cell, and if the voltage does not exceed the threshold a bit value of 0 is sensed on the bit lines. Thus, if the appropriate amount of time does not elapse, such that the relevant voltages fail to develop on the bit lines, a sense operation on the bit lines may incorrectly sense a 0. But, asserting the word line signal for an excessive amount of time will cause the voltages to develop more than is necessary, and additional power is expended asserting the word line beyond the time necessary to develop the threshold voltage is wasted. So, in embodiments the pulse width of the word line signal (and accordingly the period over which it is asserted) is tailored for each word line.

As a result, data stored in the memory cell (MC11) is sensed at operation 660 on local bit line pair (LBL1, LBLB1) and the sensed signal is supplied to the data line pair (DL1, DLB1). Thereafter, at operation 670 the output array 170 connects the global bit line pair (GBL1, GBLB1) to the data line pair (DL1, DLB1), thus transferring the low voltage level from the data line to a global bit line, GBL1 or GBLB1, whereby the complementary bits of data are read from the memory cell (MC11).

Since read operations on the memory cells (MC12, MC13, MC14) are similar to those described above with respect to the memory cell (MC11), a detailed description thereof is omitted herein for the sake of brevity, except to note that each read operation will involve an adjusted CS generated based on the row address of the memory cell to be read as specified in the RAS signal. The adjusted CS signal will have a pulse width that dictates the pulse width of the word line, which is designed in proportion to the length of time for the RM to develop based on the length (RC characteristics) of the bit lines associated with each memory cell (be it MC12, MC13, or MC14). Because each WL pulse width varies, the amount of time before each SAE signal is asserted varies, thereby minimizing the time the SAE signal needs to be asserted for each read operation, by ensuring it is only asserted when sufficient time has passed for the RM to develop before sensing.

Although the memory device 100 is exemplified as generating word line signals that have varying pulse widths during read operations on the memory cells (MC) thereof, it should be understood that, after reading the present disclosure, the memory device 100 may generate such word line signals during write operations on the memory cells (MC) thereof. Also, although the memory device 100 is exemplified as generating a varying world line pulse width by (i) tying the pulse width of a word line to the pulse width of the CS, and (ii) varying the CS based on addressed word line, the word line pulse width may be varied in any suitable manner.

Figure 7:
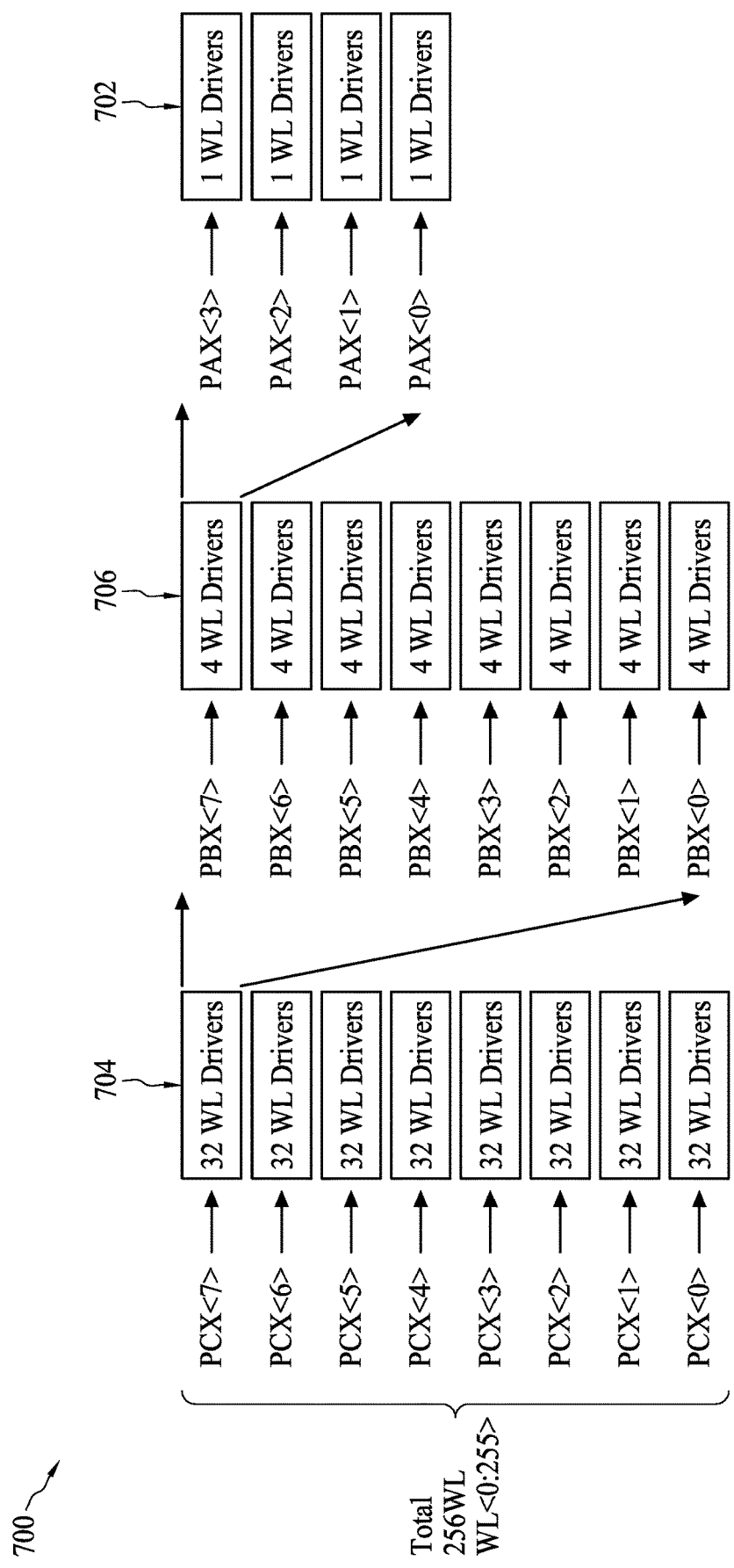
FIG. 7 illustrates one word line (WL) addressing scheme in accordance with the present disclosure.

As illustrated by the addressing scheme 700 for various embodiments illustrated in FIG. 7, a memory array may include 256 word lines driven by 256 word line drivers, e.g. word line driver 702. Each word line driver, e.g. 702, is individually addressed using an eight bit address XA<0:7>. The 256 word line drivers are organized into eight groups, e.g. group 704, each including thirty-two word line drivers, e.g. 702, for driving thirty-two word lines and organized into sub-groups, e.g. sub-group 706. While columns, or individual bit lines, of a memory array may also be addressable, for the purposes of this illustration, it is assumed that each memory cell associated with a particular word line is the same distance from a corresponding sense amplifier, such that the length of any given bit line is the same for each memory cell associated with a particular word line. For simplicity of this exemplary illustration, it is further assumed that each memory cell associated with each word line within a group of word lines, e.g. group 704, is substantially the same distance from each respective sense amplifier such that each group, e.g. group 704, corresponds to the same word line pulse length. Alternatively, the distance between memory cells associated with a word line group, e.g. group 704, and a respective sense amplifier may vary, but such variations are acceptable with a range of distances having rise times within an associated word line pulse length.

First a pre-decoding rule may be applied to address XA in order to resolve it into three illustrative sub-addresses PAX, PBX, and PCX:XA<0:1>→PAX<0:3>, XA<2:4>→PBX<0:7>, and XA<5:7>→PCX<0:7>. In this way, the three most significant bits of address XA (i.e. XA<5:7>) correspond to one of eight addressable word line groups, addressable by PCX. Each of the eight word line driver groups addressable by a bit of PCX, e.g. like group 704, includes eight sub-addressable word line driver sub-groups, e.g. like sub-group 706, each individually addressable by the second three most significant bits of XA as decoded to one of eight bits of PBX. And, each sub-group addressed by PBX, e.g. sub-group 706, includes four addressable word line drivers, e.g. like word line driver 702, each addressable by the two least significant bits of XA as decoded to one of four bits of PAX. In this way, each of the eight groups of word lines addressed by PCX includes 32 word line drivers for driving 32 word lines. And, because XA<5:7>→PCX<0:7> maps three bits of XA to a one of the eight bits of PCX, each respective single bit of PCX may be used to address one group, e.g. group 704, of word line drivers corresponding to a same word line pulse width.

Figure 11:
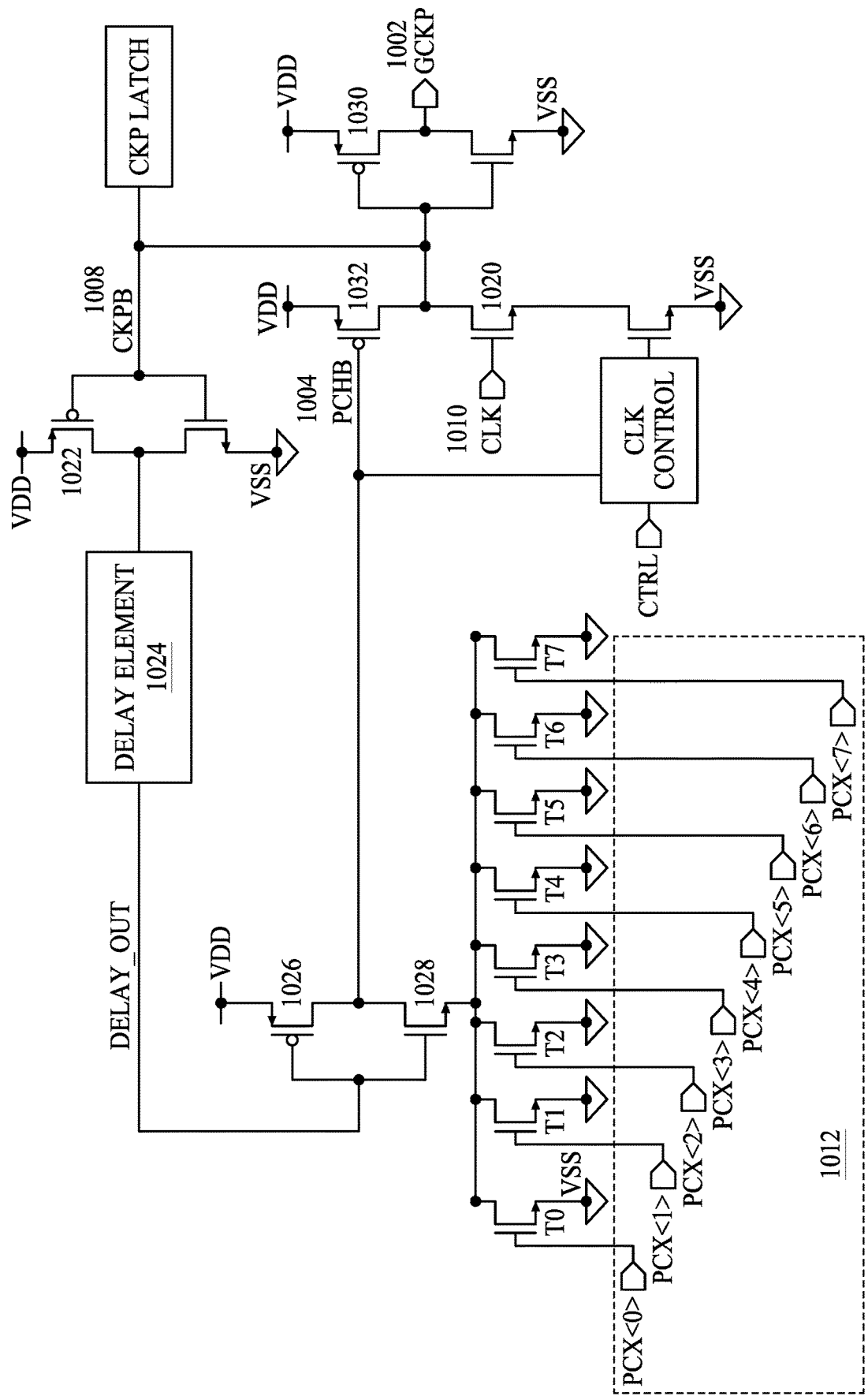
FIG. 11 illustrates various embodiments of circuits usable to generate a varying width clock pulse.

For illustrative examples, in some embodiments, each bit of PCX may be tied to eight different transistors (e.g. as illustrated in FIG. 11) and when XA<5:7>=<011>, PCX<3>=<00001000> and a fourth of the eight transistors may be activated causing the pulse width to be of a length L(4). Or when XA<5:7>=<101>, PCX<5>=<00100000> and a sixth of the eight transistors may be activated causing the pulse width to be of a length L(6). Or, when XA<5:7>=<000>, PCX<0:7>=<00000001> and a first of the eight transistors may be activated causing a pulse width of a length L(1), or when XA<5:7>=<111>, PCX<0:7>=<10000000> and an eighth of the eight transistors may be activated causing a pulse width of L(8).

For the purpose of this illustrative example, as discussed above, it is assumed that within each word line group addressed by PCX, e.g. group 704, each word line in each sub-grouping, e.g. sub-group 706, is substantially the same distance to a respective sense amplifiers. Thus, the memory device organization scheme of FIG. 8 may be employed to generate a variable pulse width such that each group, e.g. group 704, has a unique pulse width tailored for the distance between each memory cell addressable within a word line group, e.g. group 704. As used herein, because distance is related to the amount of time necessary to develop bit line voltages within read margin, substantially the same distance indicates that each memory cell within a word line driver group, e.g. group 704, may be addressed by a word line pulse having a single pulse length that sufficient to ensure enough time to develop bit line voltages for an accurate memory operation.

Figure 8:
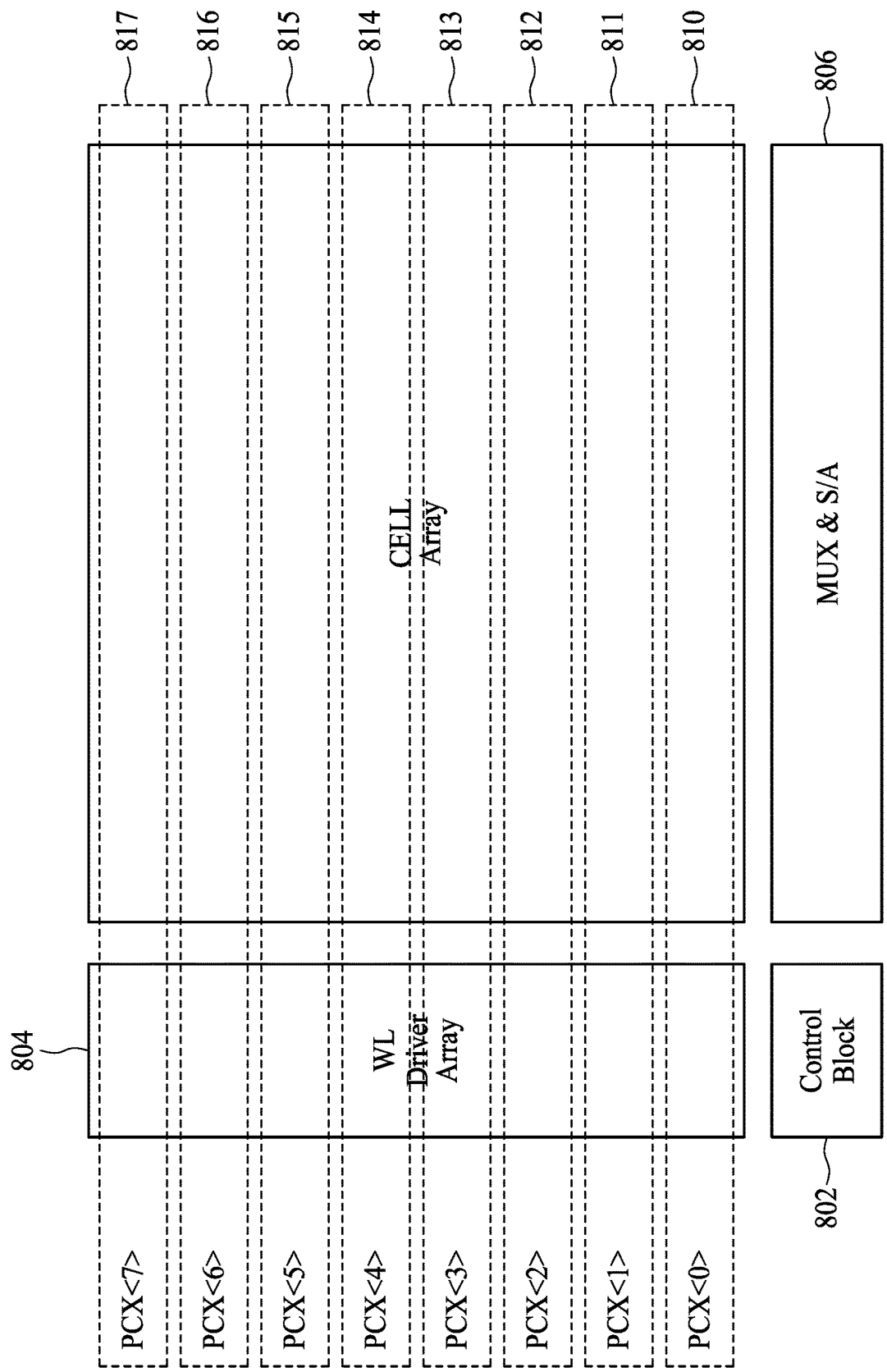
FIG. 8 illustrate individually addressable word line cells in accordance with the present disclosure.

FIG. 8 depicts an organizational scheme for a memory device having eight word line driver groups 810-817, each addressed (like group 704) by one bit from PCX<7>–PXC<0>. Each group 810-817 includes thirty-two word lines (not shown) sub-addressed by bits PBX, PAX in similar manner as illustrated in addressing scheme 700. Each word line driver group 810-817 is addressed by one bit of PCX<7>–PCX<0> by the word line driver 804. Each group of word lines 810-817 associated with each respective address bit PCX<7>–PXC<0> is increasingly far from MUX & sense amplify (S/A) components 806 in ascending order of PCX. That is the group 810, addressed by bit PCX<0>, is closer to MUX & S/A 806 than group 813 addressed by PCX<3>. Accordingly, each of the individual word lines in word line group 813, addressed by PCX<3> (and sub-addressed by PBX and PAX), takes a longer amount of time for the read margin to develop at MUX & S/A 806 than the word lines of groups 810-812, respectively addressed by PCX<0>, PCX<1>, or PCX<2>.

Control block 802 may receive the external input signals (e.g. CLK or ADDR) and generate the internal clock signals (e.g. CS or GCKP) and the sense amplify enable signal (SAE). Thus, in this illustrative example, control block 802 is capable of generating a memory device internal clock signal (GCKP) having one of eight different pulse widths (each of the eight different pulse widths associated with each of the eight PCX addressable groups 810-817). Control block 802 is also configured to assert a sense amplify enable signal after one of eight time periods (in one example, by asserting SAE on the falling edge of the WL signal) respectively associated with each of the eight groups 810-817.

An organizational scheme for addressing groups of word lines so as to allow for tailoring the length of a word line pulse and for asserting a corresponding SAE signal at the correct time is described with respect to FIG. 8 in terms of eight word line groups having corresponding word line subgroups of word line drivers organization scheme. But, embodiments illustrated by FIG. 8 are not intended to be limiting, and such an organizational scheme may take many forms comprising any number of groups and sub-groups (or no groups) resulting in any number of word line pulse lengths and associated addressing schemes.

Figure 9:
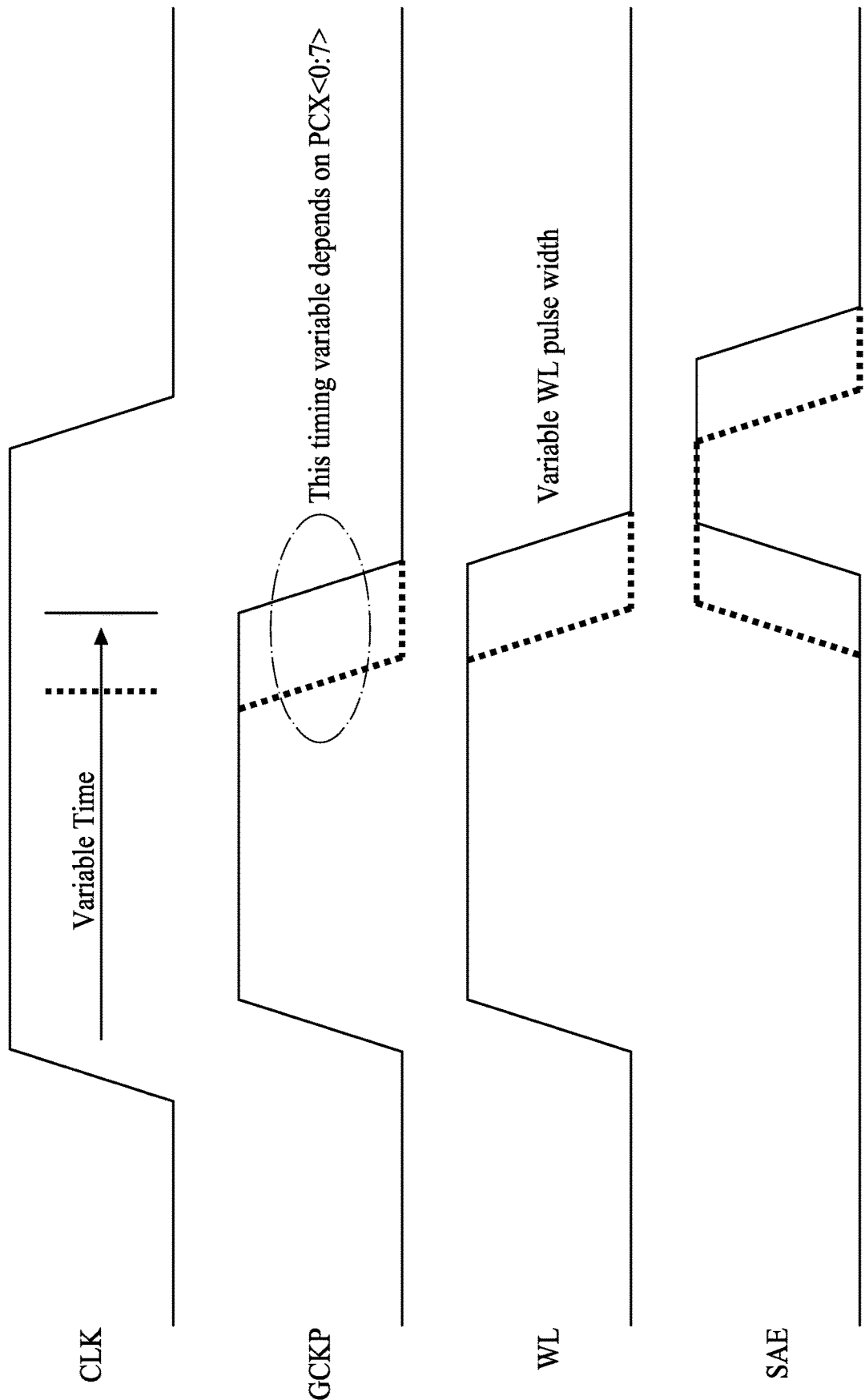
FIG. 9 illustrates various signals employed in driving a word line in a memory application in accordance with the present disclosure.
Figure 10:
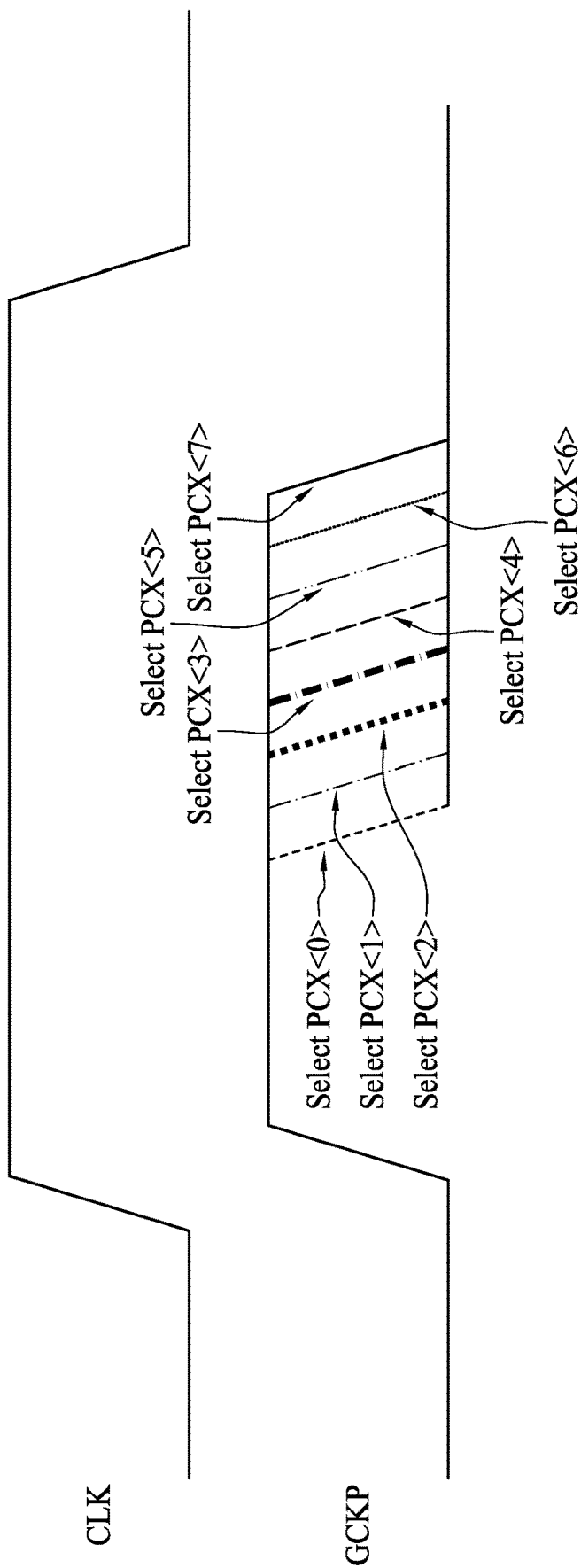
FIG. 10 illustrates various signals employed in driving a word line in a memory application in accordance with the present disclosure.

FIG. 9 illustrates one set of timing signals in accordance with some embodiments of this disclosure to illustrate the variable timing. CLK is an externally derived clock signal. GCKP is a clock signal generated for memory device operation control, and may be generated by any suitable circuit, for example, by the control block 802, or by clock generator 130, or by a circuit within word line driver 140. For example, GCKP may be generated based in response to a rising edge of an externally generated clock signal, CLK. Based on GCKP, the word line and SAE signals are derived, among other control signals. In embodiments, the word line WL is derived from the GCKP signal, such that the pulse width of WL is based on the pulse width of the GCKP signal. And, the SAE signal is synchronized to the falling edge of the WL signal, causing the sense amplifiers to activate after sufficient time has passed for the corresponding read margin to develop, thereby ensuring a proper read at the right time. In addition to reducing power consumed by overly long word length pulses, this configuration also minimizes the time sense amplifiers are enabled, thereby also conserving additional power. The pulse width of the GCKP signal is defined by PCX<0:7>, as illustrated in FIG. 10.

Figure 12:
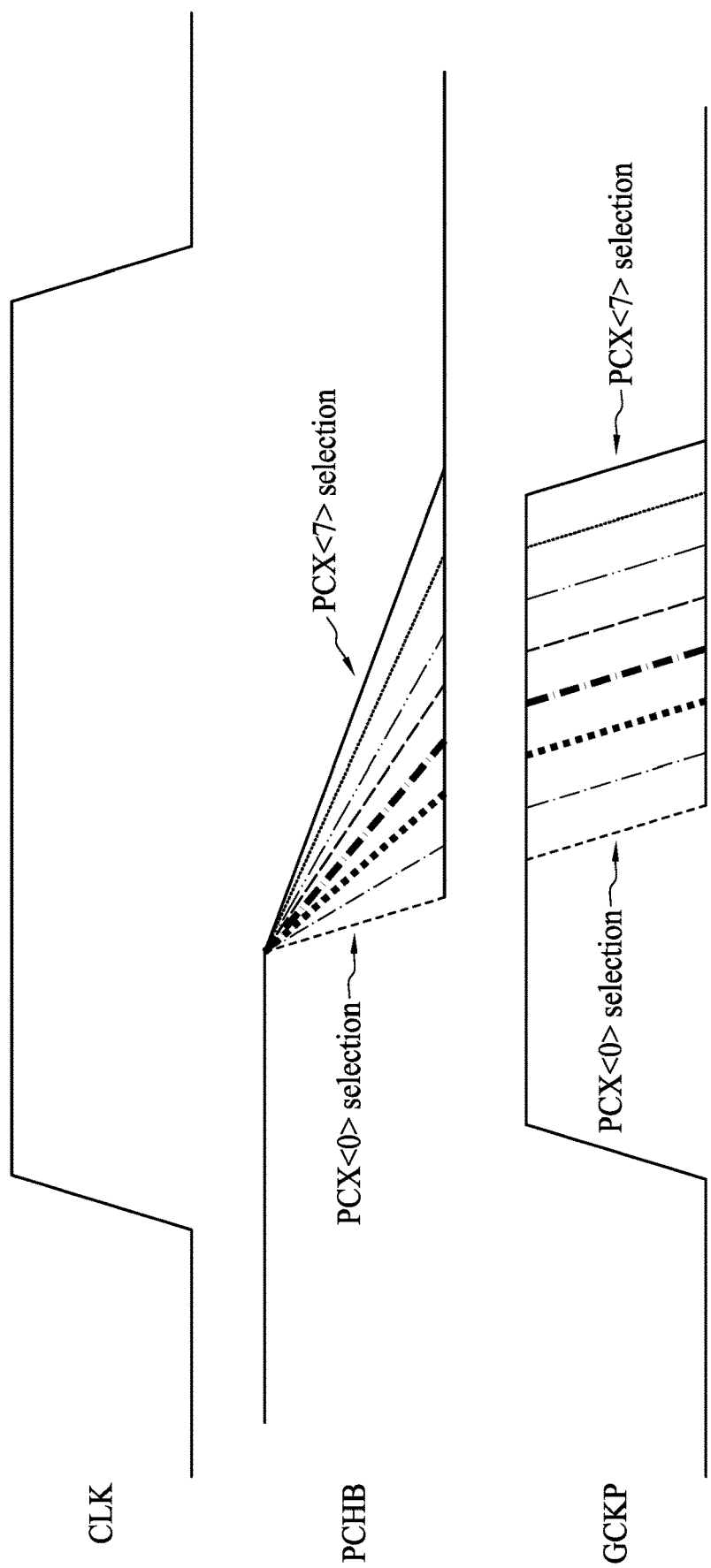
FIG. 12 illustrates various signals employed in driving a word line in a memory application in accordance with the present disclosure.

FIG. 11 illustrates one circuit for generating clock signal GCKP 1002 with a varying pulse width based on an address decoded into one of eight signals PCX<7>–PCX<0>. Signal PCHB 1002 controls the pulse width of GCKP 1002 after a CLK 1010 signal is asserted. When CLK 1010 is high, CKPB 1008 is pulled low through transistor 1020, which pulls DELAY_OUT high through transistor 1022 and delay element 1024, which turns off the transistor 1026 pulling PCHB 1004 high, and PCHB 1004 is discharged through transistor 1028 and one of transistors T0-T7, each individually addressed by one of the bits PCX<0:7>1012, and each having different W/L configurations, and thus a different effective RC constant resulting in differing discharge times. Similarly, when CKPB 1008 is pulled low, GCKP 1002 is pulled up through transistor 1030 to VDD creating the rising edge of the clock signal GCKP 1002. Each of T0-T7's W/L configuration is designed to create a different discharge time on PCHB 1004 that allows GCKP 1002 to remain high. The varying W/L configurations of T0-T7 effectively create a different discharge slope for PCHB 1004, thus varying the time before CKPB 1008 is pulled high again through transistor 1032, and thereby pulling GCKP 1002 low. The varying slopes and the resulting varying PCHB 1004 and GCKP 1002 signals are illustrated in FIG. 12.

Figure 13:
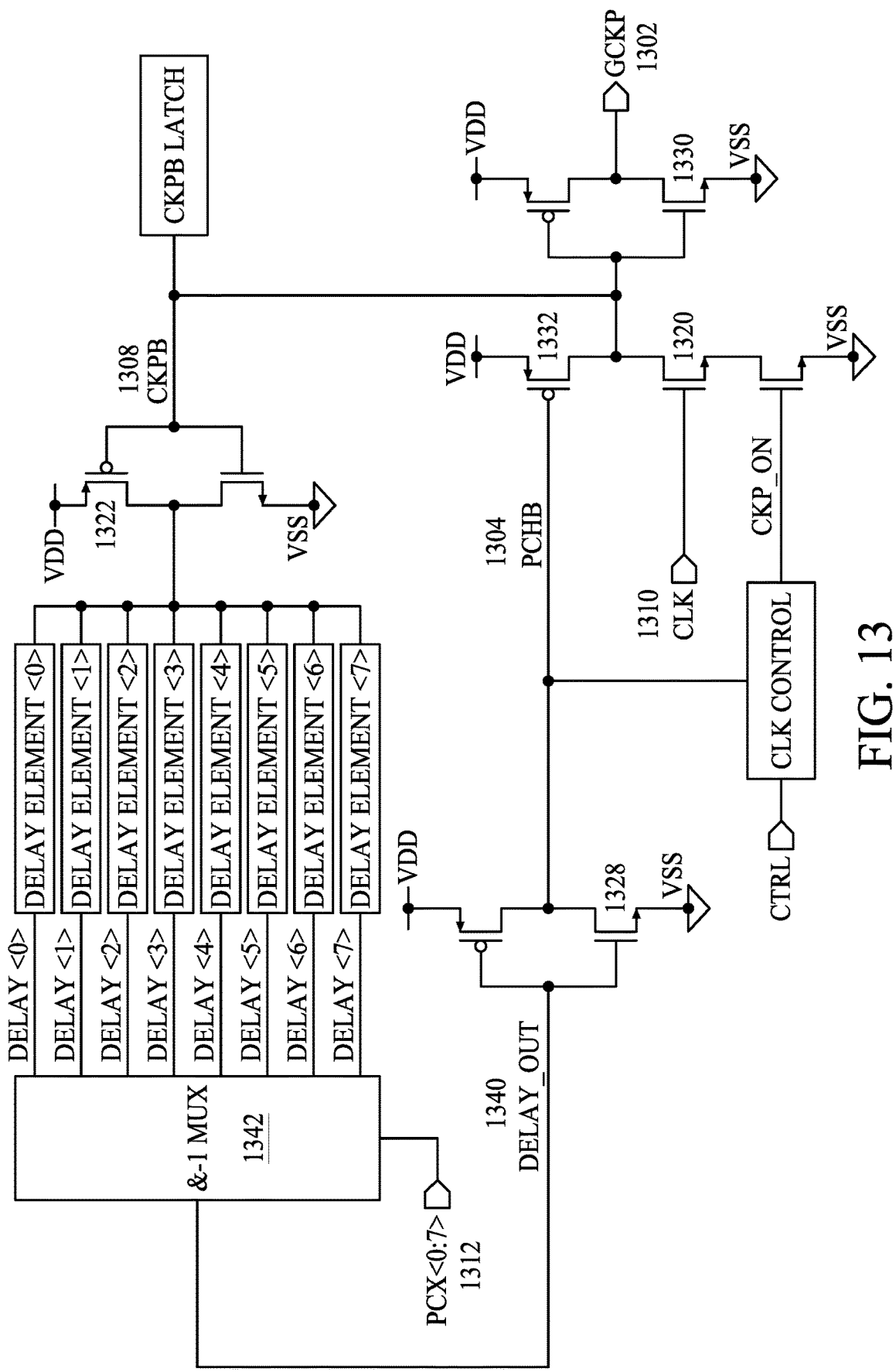
FIG. 13 illustrates various embodiments of circuits usable to generate a varying width clock pulse.

FIG. 13 illustrates another embodiment of a circuit for generating a varying pulse width GCKP 1302. When CLK 1310 pulses high, CKPB 1308 is pulled low through transistor 1320, which in turn turns on a pull up transistor 1332 that feeds one of eight delay elements (Delay Element<0>–Delay Element<7>). Each of the eight delay elements Delay Element<0>–Delay Element<7> delays the signal according to one of eight different time periods and through 8:1 mux 1342 and onto DELAY_OUT 1340, after which the high signal on DELAY OUT 1340 turns on the pull down transistor 1328, which pulls down PCHB 1304 causing CKPB 1308 to be pulled high again through transistor 1332, which in turn pulls GCKP low to VSS through transistor 1330 thereby causing GCKP to have one of eight pulse widths according to the eight different delay time periods associated with the Delay Element<0>–Delay Element<7> that is addressed by PCX<0:7>1312.

In an embodiment, a memory device comprises a plurality of memory cells, a plurality of word lines, and a word line driver. The plurality of memory cells include first and second memory cells. The plurality of word lines include first and second word lines respectively coupled to the first and second memory cells. The word line driver is configured to respectively drive the first and second word lines with first and second word line signals that have varying pulse widths.

In an interrelated embodiment, a method comprises generating an output clock signal and receiving an address of a memory cell to adjust a pulse width of the output clock signal.

In another interrelated embodiment, a method an address of a first memory cell is received. An output clock signal is generated having a first pulse width associated with the first memory cell. And, an address of a second memory cell is received. An output clock signal is generated having a second pulse width associated with the second memory cell that is different than the first pulse width associated with the first memory cell.

In another interrelated embodiment, a memory device comprises a plurality of memory cells and a clock generator. The clock generator is configured to generate an output clock signal, a pulse width of which varies with a time duration within which a read margin associated with a memory cell decreases from a high voltage level to less than a threshold level.

In another interrelated embodiment, a memory device comprises a first memory cell a first distance from a first sense amplifier. The memory device also includes a second memory cell a second distance from a second sense amplifier, the second distance different than the first distance. The memory device also includes a clock generator configured to selectively generate an output clock signal having a pulse duration. The pulse width duration may be a first clock signal pulse duration associated with the first distance. Or, the pulse width duration may be second clock signal pulse duration associated with the second distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for generating a varying pulse width clock signal which varies with an address of a memory cell, the circuit comprising:
   a sub-address of the address of the memory cell connected with N bits into an N-to-1 multiplexer with N delay elements;
   an output of the N-to-1 multiplexer connected to a gate of a first transistor and a gate of a second transistor, wherein a drain of the first transistor and a drain of the second transistor are electrically connected to a gate of a third transistor;
   a gate of a fourth transistor driven with an external clock signal, wherein a drain of the fourth transistor and a drain of the third transistor are electrically connected to a gate of a fifth transistor and a gate of a sixth transistor; and
   a drain of the fifth transistor connected to each of the N delay elements.

2. The circuit of claim 1, wherein when the external clock signal is high, the gate of the fifth transistor is pulled low through the fourth transistor.

3. The circuit of claim 1, wherein the fourth transistor turns on the third transistor as a pull-up transistor.

4. The circuit of claim 1, wherein the third transistor feeds on one of the N delay elements, wherein each of the N delay elements delays the external clock signal according to one of N different time periods, and through the N-to-1 multiplexer to the output of the N-to-1 multiplexer.

5. The circuit of claim 1, further comprises a high external clock signal on the output of the N-to-1 multiplexer turning on the first transistor.

6. The circuit of claim 1, wherein the first transistor pulls down the gate of the third transistor causing the gate of the fifth transistor to be pulled high again through the third transistor.

7. The circuit of claim 1, wherein the third transistor pulls the varying pulse width clock signal low to a supply voltage Vss level through the sixth transistor.

8. The circuit of claim 1, wherein the varying pulse width clock signal has one of N pulse widths according to N different delay time periods associated with the N delay elements addressed by the sub-address.

9. A circuit for generating a varying pulse width clock signal which varies with an address of a memory cell, the circuit comprising:
   a plurality of transistors, wherein each of the plurality of transistors is individually addressed by one of a plurality of bits of a sub-address of the address of the memory cell;

a first transistor, wherein a source of the first transistor is electrically connected to a drain of each of the plurality of transistors;

a second transistor, wherein a source of the second transistor is electrically connected to the source of the first transistor;

a third transistor, wherein a drain of the first transistor and a drain of the second transistor are electrically connected to a gate of the third transistor;

a fourth transistor, wherein a drain of the third transistor and a drain of the fourth transistor are electrically connected, wherein a gate of the fourth transistor is driven by an external clock signal;

a fifth transistor, wherein a gate of the fifth transistor is electrically connected to the drain of the third transistor and the drain of the fourth transistor; and a sixth transistor, wherein a gate of the sixth transistor is electrically connected to the gate of the fifth transistor, wherein a drain of the sixth transistor drives the varying pulse width clock signal.

10. The circuit of claim 9, wherein the plurality is equal to $2^N$, wherein N is a non-negative integer.

11. The circuit of claim 9, wherein when the external clock signal is high, the gate of the fifth transistor is pulled low through the fourth transistor.

12. The circuit of claim 9, wherein the circuit further comprises a delay element; wherein an output of the delay element is electrically connected to a gate of the first transistor and a gate of the second transistor; and wherein the fifth transistor and the delay element pull the output of the delay element high.

13. The circuit of claim 12, wherein the output of the delay element turns off the second transistor and pulls the gate of the third transistor high.

14. The circuit of claim 9, wherein the gate of the third transistor is discharged through the first transistor and one of the plurality of transistors is individually addressed by one of the plurality of bits of the sub-address.

15. The circuit of claim 9, wherein the varying pulse width clock signal is pulled up through the sixth transistor to a supply voltage Vdd creating a rising edge of the varying pulse width clock signal.

16. The circuit of claim 9, wherein different word line configurations of the plurality of transistors create different discharge times for the gate of the third transistor to allow the varying pulse width clock signal to remain high.

17. The circuit of claim 9, wherein the plurality of transistors each having a different word line configuration; and wherein the different word line configurations of the plurality of transistors create different discharge slopes for the gate of the third transistor, to vary a time before the gate of the fifth transistor is pulled high again through the third transistor, to pull the varying pulse width clock signal low.

18. A circuit for generating a varying pulse width clock signal which varies with an address of a memory cell, the circuit comprising:

a plurality of transistors;

a first transistor electrically connected to a drain of each of the plurality of transistors;

a second transistor electrically connected to a source of the first transistor;

a third transistor electrically connected to the first transistor and the second transistor;

a fourth transistor electrically connected to the third transistor, wherein the fourth transistor is driven by an external clock signal;

a fifth transistor electrically connected to the third transistor and the fourth transistor; and a sixth transistor electrically connected to the fifth transistor, wherein the sixth transistor drives the varying pulse width clock signal.

19. The circuit of claim 18, wherein the third transistor feeds on one of N delay elements, wherein each of the N delay elements delays the external clock signal according to one of N different time periods, and through an N-to-1 multiplexer to an output of the N-to-1 multiplexer.

20. The circuit of claim 19, wherein N is equal to $2^K$, where K is a non-negative integer.

* * * * *